INPUT SYSTEM FOR ELECTRICAL AMPLIFIERS

Original Filed June 16, 1928 3 Sheets-Sheet 1

Inventors:
Frederick H. Drake,
William D. Loughlin,
By Byrne Townsend & Brickenstein,
Attorneys

INPUT SYSTEM FOR ELECTRICAL AMPLIFIERS

Original Filed June 16, 1928 3 Sheets-Sheet 2

Inventors:
Frederick H. Drake,
William D. Loughlin,
By Byrne Townsend & Brickenstein,
Attorneys

INPUT SYSTEM FOR ELECTRICAL AMPLIFIERS

Original Filed June 16, 1928 3 Sheets-Sheet 3

λ = Meters Wavelength

Inventors:
Frederick H. Drake,
William D. Loughlin,
By Byrne Townsend & Brickenstein,
Attorneys Reissued Mar. 17, 1936

Re. 19,892

UNITED STATES PATENT OFFICE 19,892

INPUT SYSTEM FOR ELECTRICAL AMPLIFIERS

Frederick H. Drake and William D. Loughlin, Boonton, N. J., assignors, by mesne assignments, to Radio Corporation of America, New York, N. Y., a corporation of Delaware Original No. 1,843,018, dated January 26, 1932, Serial No. 285,886, June 16, 1928. Application for reissue January 26, 1934, Serial No. 708,375

4 Claims. (Cl. 250—20)

This invention relates to electrical amplifier circuits, and more especially to an input system for such amplifier circuits. It is particularly applicable to an input system for a radio frequency amplifier of a type suitable for use in radio receiving sets, and the invention will hereafter be described in connection with such an amplifier, in which connection it has many advantages.

An object of the invention is to provide such an input system constituting a desirable means for coupling an antenna or other collecting device to a radio frequency amplifier. A further object is to provide such an input system including a volume control. Other objects of the invention will appear from the following description.

Figure 1:
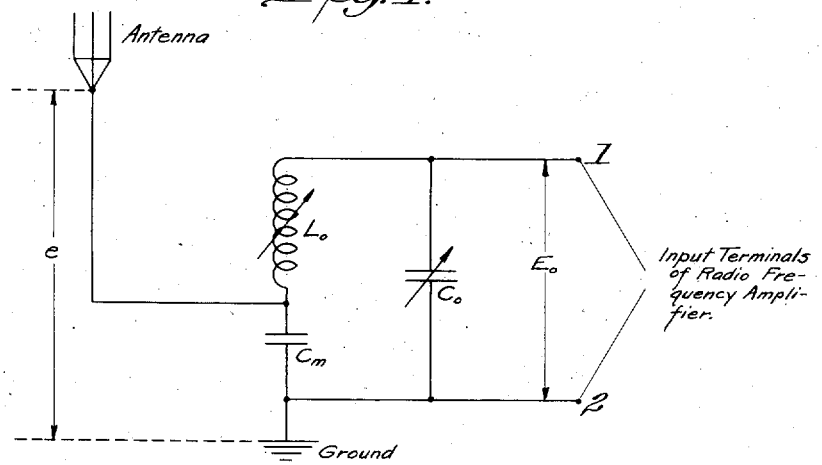
Figure 2:
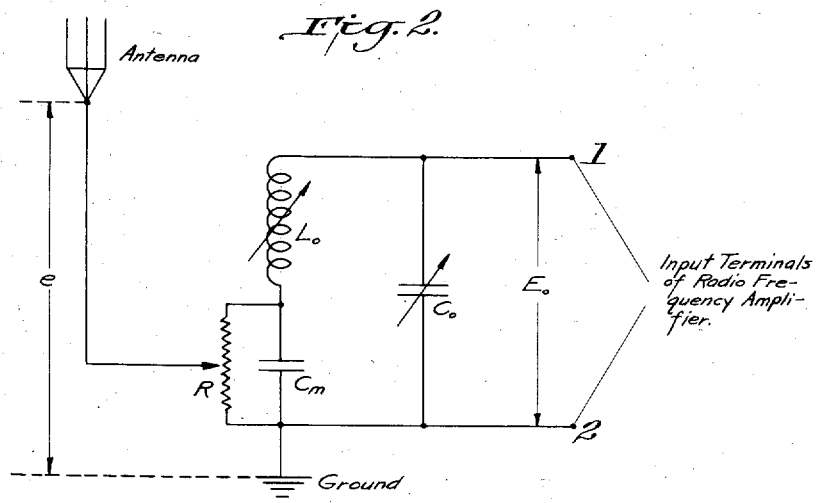
Figure 3:
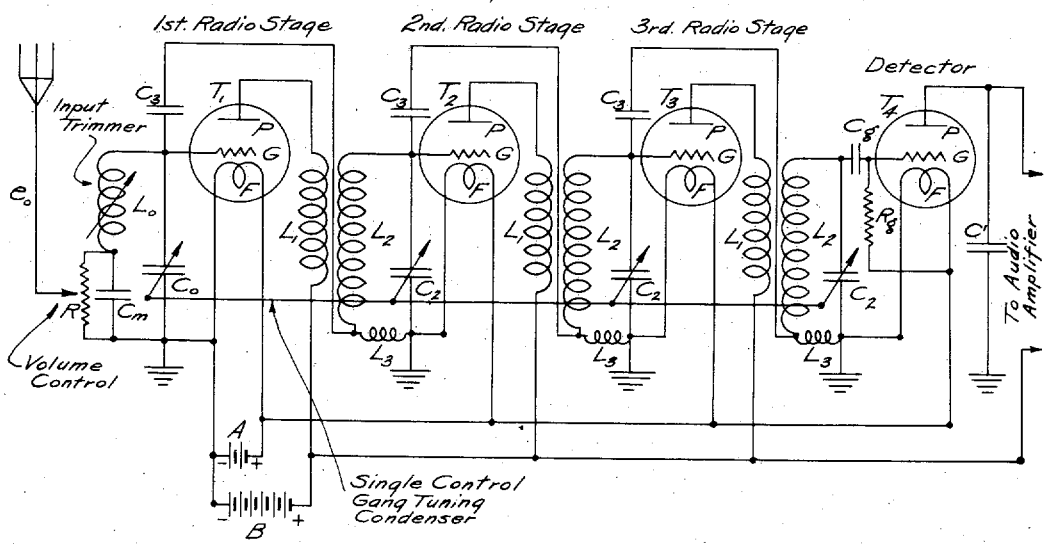
Figure 4:
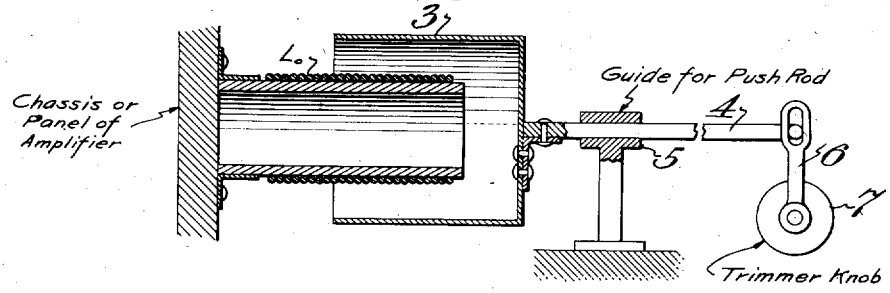
Figure 5:
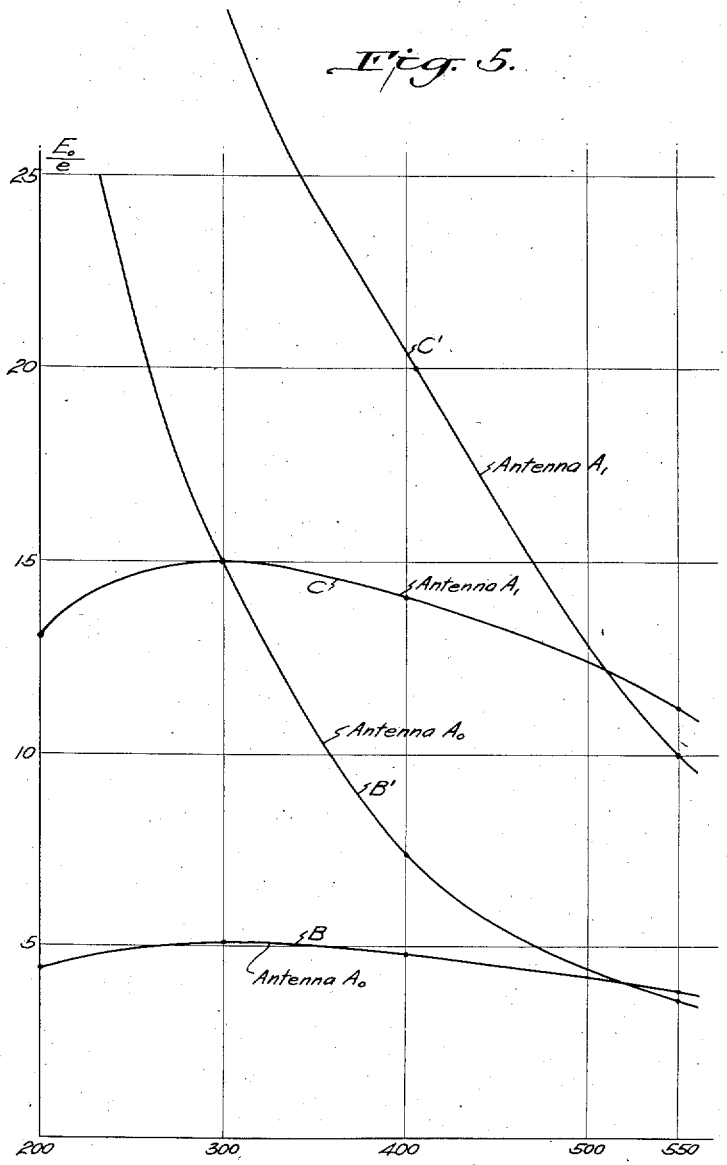

Figure 1 is a diagram of one form of input system embodying the invention and showing the antenna and ground connections. Figure 2 shows a similar input system including a volume control. Figure 3 shows a multi-stage radio frequency amplifier including an input system similar to that of Figure 2. Figure 4 shows one construction of a trimmer for use in an input system according to the invention. Figure 5 is a graph showing curves of the wavelength characteristic of certain input systems.

Referring now to Figure 1, the input system comprises a tuned circuit including in series a fixed condenser $C_m$, an inductance $L_o$ of adjustable value (i. e. a "trimmable" inductance or "trimmer") and a variable tuning condenser $C_o$ connected across said fixed condenser and trimmable inductance. The terminals 1 and 2 of the tuning condenser $C_o$ may suitably constitute the input terminals of a radio frequency amplifier, for example the grid and cathode of the first tube. The antenna may be connected or coupled to a point between $L_o$ and $C_m$, the other side of $C_m$ being grounded.

Although the invention is not limited to any particular values for the several circuit elements, the following approximate values (here given as an example only) have been successfully employed:

$C_m = 1000\mu\mu f$
$C_o(_{max}) = 400\mu\mu f$
$L_o = 170\text{–}240$ m. h. (trimming range)

In other cases a valve of $C_m = 2000\mu\mu f$ has been employed with good results.

It will be observed that the total tuning capacity of the input system, with the antenna removed, is:—

$$C_t = \frac{C_o \cdot C_m}{C_o + C_m} = \frac{C_o}{1 + \frac{C_o}{C_m}}$$

The antenna capacity is effectively in parallel with $C_m$ and acts to increase the effective value of $C_m$ in the above equation.

If $C_m$ is large compared with $C_o$, as is the case when the circuit is tuned to short wavelengths, the term $$1 + \frac{C_o}{C_m}$$

approaches 1, and the tuning capacity $C_t$ is substantially equal to the capacity of the tuning condenser $C_o$. Since an important application of the invention is to arrangements in which the input tuning condenser $C_o$ is one of a gang of condensers operated by a single control, it is important to have the product $L_o C_t$ "track" or remain in alignment with the "LC" products of the other tuned circuits, so that all of the tuned circuits tune to resonance together, and it will be seen that this is what occurs if $$\frac{C_o}{C_m} << 1,$$

(i. e. is negligible in comparison with 1) for example at short wavelengths. At the same time, at short wavelengths the voltage, $e$, between antenna and ground, is applied to the tuned circuit $L_o$—$C_o$—$C_m$ by means of the coupling between that circuit and the antenna through the capacity $C_m$. $C_m$ being fixed, this coupling decreases at short wavelengths, and increases at long wavelengths. As a result of this arrangement, the wavelength characteristic of the input system is of more desirable form than has been hitherto obtainable, and by proper proportioning of the constants of this circuit, the wavelength characteristic may be made uniform or substantially constant over the wavelength range for which the system is designed.

Figure 5 shows certain wavelength characteristic curves, obtained by plotting $E_o/e$ (i. e. the ratio of the voltage $e$ induced in the antenna by the signal, to the voltage $E_o$ across the tuning condenser $C_o$, against wavelength ($\lambda$) in the broadcast range) for a typical input system according to the present invention and for a typical input system according to one of the most widely used prior art arrangements. Curve B is a characteristic curve of $$\frac{E_o}{e}$$

against wavelength for an input system according to the present invention, as obtained with antenna $A_o$, which was a single-room indoor antenna approximately 25 feet in length and 100$\mu\mu f$ capacity. Curve B′ is a typical characteristic curve, obtained with the same antenna $A_o$, for an input system according to the prior art in which the antenna is coupled to a tuned input circuit either through a small series capacity, or through a small coil coupled to a coil of the tuned input circuit, either prior art arrangement resulting in substantially the same characteristic curve. Curves C and C′ are similar curves for the same input systems but were obtained with antenna $A_1$, which was a short outdoor antenna of approximately 250$\mu\mu f$ capacity.

In the case of input circuits of the type involving inductive coupling and fixed inductances tuned to resonance at different wavelengths by variable condensers, as has heretofore been the usual arrangement, the wavelength characteristic curve ordinarily has the shape of curves B′ and C′ of Figure 5. This shape of characteristic curve is undesirable, especially in the case of input systems for use with radio frequency amplifiers, for a number of reasons. For example, such amplifiers are much more apt to be unstable at short wavelengths than at long wavelengths, due to the increased capacity and magnetic couplings in the amplifier at short wavelengths. To avoid instability, excessive sensitivity, or tendency to oscillate, it is frequently desirable to impart to such an amplifier, if possible, an amplification characteristic curve which is substantially constant over a range of wavelengths, or which at least has a minimized rise at short wavelengths. Whether or not such a characteristic is imparted to the amplifier, it is highly desirable that the input voltage impressed upon the input terminals of the radio frequency amplifier should not be very greatly higher at short wavelengths than at long wavelengths, and it is preferable that the voltage should be substantially constant over the wavelength range of the amplifier, since otherwise the undesirable sloping characteristic of the radio frequency amplifier, already higher at short wavelengths than at long wavelengths, will have superimposed upon it another undesirable sloping characteristic of the same type, making an over-all amplification which is so much higher at short than at long wavelengths as to produce oscillation, instability, excessive sensitivity and other undesirable effects. For the purpose of avoiding this condition, it is desirable therefore to employ an input system having a wavelength characteristic curve resembling the curves shown at B and C of Figure 5, which curves were obtained with an input system according to the present invention designed for use in a broadcast radio receiving set, and which are substantially constant over the broadcast range of wavelengths from 200–550 meters. Such wavelength characteristics are possessed by input systems according to the present invention, and constitute an important advantage thereof.

Figure 2 shows the invention applied to an input system including a volume control arrangement as an integral part thereof. This is provided by the resistance R connected across the fixed capacity $C_m$, and provided with a variable tap connected to the antenna. When this antenna tap is at the top of the resistance R, the antenna has maximum coupling to the input circuit through $C_m$ so that the full incoming signal is impressed upon a succeeding amplifier, and as the tap is moved down along R the antenna is connected more and more nearly directly to ground, so that less and less of the received signal is impressed upon an amplifier with which the input system is associated. At the bottom position of the tap, the antenna is grounded, and there is substantially no coupling to the input system.

In one such arrangement, which has been found to give an excellent volume control effect, the resistance R had a value of 50,000 ohms when the other constants of the input system were as given in the above example in connection with Figure 1.

It is to be noted that the volume control arrangement described above is not of general applicability to tuned input systems of the types hitherto employed, but can only be successfully employed, so far as is now known, with an input system according to the present invention, since the antenna capacity is very small as compared to the value of the fixed capacity $C_m$. The adjustment of the resistance R therefor exercises substantially no detuning effect.

Figure 3 shows the combination of an input system and volume control arrangement according to the present invention with a tuned radio frequency amplifier of the type described and claimed in United States Patent No. 1,672,811, issued June 5, 1928. In this arrangement $T_1$, $T_2$ and $T_3$ are three electron or vacuum tubes in three radio frequency amplifier stages working into a detector stage including tube $T_4$. An input system $L_o$—$C_o$—$C_m$—R according to the present invention is arranged between grid G and cathode F (which may be grounded as shown) of the tube $T_1$ in the first radio frequency stage. Each tube has a plate coil $L_1$ which is coupled or connected so as to have effectively negative mutual inductance with the secondary coil $L_2$. In series with $L_2$ is connected a tertiary coil $L_3$, having negligible coupling with the coils $L_1$ and $L_2$, for which purpose it may be arranged at right angles thereto, and a tuning condenser $C_2$. A balancing capacity $C_3$ is connected between the control grid G and the junction of coils $L_2$ and $L_3$, while the cathode F is connected (ordinarily through ground) to the junction of the coil $L_3$ and the tuning condenser $C_2$. Common "A" and "B" batteries, or equivalent socket-power devices may be employed for the several stages, being suitably by-passed if desired; or alternating current filaments or cathodes of the separate heater types may be employed; and the grids G may, if desired, be biased by means of a suitably arranged "C" battery or by a biasing resistance in the filament circuit. The detector stage, including tube $T_4$, may be arranged in any suitable way, being provided for instance, with grid condenser $C_g$, grid-resistance $R_g$, and radio frequency by-pass condenser C′, the detector output terminals being suitably connected to an audio frequency amplifier and loud speaker.

Such an arrangement constitutes a balanced multi-stage amplifier, as described and claimed in above mentioned United States Patent No.

1,672,811, and is adapted for operation by a single control, all of the condensers $C_0$, $C_2$, $C_2$, $C_2$, being units of a gang. They are then operated together, and it is desirable that for any given motion of the single control which operates these condensers, each condenser shall have the same increment or decrement of capacity as all the other condensers. When such is the case, all of the circuits $L_2$—$L_3$—$C_2$ tune together and resonate to the same frequency. In order to make the circuit $L_0$—$C_0$—$C_m$—R tune and resonate with the other tuned circuits, i. e. so that the circuits tuned by condensers $C_0$ and $C_2$ "track" or remain in alignment, the inductance $L_0$ may be "trimmed" or adjusted, when necessary, by a suitable trimming adjustment, thereby obtaining exact resonance of the input system. This trimming adjustment may be employed either to take care of different antennas or other collecting devices employed in connection with the input system (as, for example, when a change is made from antenna $A_0$ to antenna $A_1$ of Figure 5, or when a single model of broadcast radio receiving set is sold to many different purchasers each erecting his own collecting device) or, in tuning the amplifier to different wavelengths on a single antenna, to keep the input system in resonance at the same wavelength as the other tuned circuits. Thus the trimming of $L_0$ takes care of departures in the value of $C_t$ from substantial equality with the value of $C_0$ for values of $C_0$ where $C_0/C_m$ is no longer negligible compared with unity.

In such an arrangement as that of Figure 3, when the radio frequency amplifier is embodied in a radio receiving set, the set normally possesses three panel controls; namely a main tuning control which operates the condensers $C_0$, $C_2$, $C_2$, $C_2$ as a gang, a trimmer which varies the inductance of $L_0$, and a volume control which operates the tap on R. Such a control system for a radio receiving set has been found to be unusually satisfactory, and is now widely used commercially.

The particular multi-stage arrangement of Figure 3 is here shown by way of example only of the combination of an input system with a single-control multi-stage tuned radio frequency amplifier, according to the present invention, and the invention is, of course, not limited thereto.

One suitable arrangement and construction for such a trimmer is shown in Figure 4, in which the coil $L_0$ is wound on a cylindrical form and mounted on the chassis or panel of a radio frequency amplifier. The inductance of the coil $L_0$ is adjusted or trimmed by means of the conducting sleeve 3, suitably composed of copper or the like. This sleeve is moved back and forth over the coil $L_0$, so as to surround more or less of it, by means of the push rod 4 moving in guide 5, and operated by the lever or crank 6 and control knob 7. In one such construction which has been successfully employed, the coil $L_0$ had a diameter of approximately one inch, being composed of about 135 turns of #34 enamel wire, and the movable shield 3 had a diameter of about 1½". This was found to give a decrease in the inductance of coil $L_0$ of about 30% of its maximum value when the shield 3 was moved so as to substantially cover the coil.

In addition to the advantages already described as resulting from an input system according to the present invention, the following advantages may be mentioned:—The amount of trimming which is required is very small compared with that which is frequently necessary with other arrangements, and this results in extreme ease in tuning to different wavelengths, and in picking up different broadcast stations with a radio receiving set embodying the arrangement. When the volume control is changed the resultant detuning of the system is very small. It is an easy matter to accommodate the system to different types of antennas or other collecting devices. At short wavelengths the coupling of the input system to the antenna is weak, which is desirable, as pointed out above, since excessive amplifications are not required at short wavelengths. Moreover, the selectivity of the system is high at short wavelengths, where an ordinary radio frequency amplifier is ordinarily relatively non-selective. In the case of a trimmer arrangement such as that shown in Figure 4, the position of the conducting sleeve at short wavelengths is over the coil, and the sleeve thus operates as a shield for the coil at those frequencies when shielding is particularly required.

Other advantages of an input system according to the present invention will have appeared from the foregoing description; and the invention is not limited to the particular arrangements or constants herein shown or described, but extends to many variations and modifications thereof, and is limited only by the teachings of the foregoing specification, by the prior art, and by the following claims.

We claim:

1. A tunable input system for an audion amplifier comprising the combination with a tuned circuit including in series a fixed condenser, an inductance and a variable condenser, of a resistance shunted across said fixed condenser, and a variable tap on said resistance, said tap and the junction of said fixed and variable condensers serving as terminals across which is impressed the incoming alternating current voltage that is to be amplified, and terminals of said variable condenser serving as output terminals across which said amplifier may be connected.

2. An input system for a radio frequency amplifier, comprising a collecting device; a tuned circuit including in series a fixed condenser, an inductance of adjustable value, and a variable condenser connected across both said inductance and said fixed condenser; a resistance connected across said fixed condenser; a connection from said collecting device to said resistance including a variable tap, said connection being arranged to constitute a volume control for an amplifier with which said input system is adapted to be associated; a connection from said fixed condenser to ground; and means for applying the voltage across said variable condenser to the input terminals of a radio frequency amplifier.

3. In radio frequency apparatus, a source of high frequency energy and a load circuit, means for coupling the source to the load circuit comprising a high frequency circuit having an input terminal, an output terminal and a common terminal, a fixed capacity connected directly between the input and common terminals, an impedance device connected across the fixed capacity, means for connecting the source of high frequency energy between the common terminal and a point of the impedance device, a variable condenser of smaller capacity than the fixed capacity connected between the output and common terminals, and an inductance device connected between the input and output terminals, said fixed capacity, variable capacity and inductance device forming a closed circuit which is tunable over a frequency range, the elements of the closed circuit being proportioned to provide uniformly high selectivity and sensitivity throughout said frequency range.

4. In radio frequency apparatus, a source of high frequency energy, a high frequency thermionic amplifier comprising a pair of thermionic tubes each having anode, cathode and grid and an electric coupling circuit connecting said tubes in cascade, means for connecting the source of high frequency energy to the thermionic amplifier comprising an input terminal, an output terminal and a common terminal, said thermionic amplifier being connected across the common terminal and the output terminal, a fixed capacity connected directly between the input terminal and the common terminal, an impedance device connected across the fixed capacity, the source of high frequency energy being connected between the output terminal and a point of the impedance device, the connection to the impedance device being variable, a variable condenser of smaller capacity than the fixed capacity connected between the output and common terminals and an inductance device connected between the input and output terminals, said inductance device, variable condenser and fixed capacity forming a closed circuit tunable over a frequency range, the elements of said closed circuit being proportioned to provide uniformly high selectivity and sensitivity throughout said frequency range, a variable condenser device in the electric coupling circuit connecting said tubes in cascade and a single means for varying the capacity of the two variable condensers in unison.

FREDERICK H. DRAKE.
WILLIAM D. LOUGHLIN.